(12) United States Patent
Lim et al.

(10) Patent No.: US 8,146,247 B2
(45) Date of Patent: Apr. 3, 2012

(54) METHOD FOR PACKAGING A SENSOR UNIT

(75) Inventors: Sin-Heng Lim, Singapore (SG); Amy Ge, Tianjin (CN)

(73) Assignee: Lite-On Singapore Pte. Ltd., Northtec (SG)

( * ) Notice: Subject to any disclaimer, the term of this patent is extended or adjusted under 35 U.S.C. 154(b) by 442 days.

(21) Appl. No.: 12/560,628

(22) Filed: Sep. 16, 2009

(65) Prior Publication Data

US 2011/0061340 A1    Mar. 17, 2011

(51) Int. Cl.
*H01K 3/22* (2006.01)

(52) U.S. Cl. .............. 29/848; 29/849; 29/856; 29/858; 250/216; 250/239

(58) Field of Classification Search ............... 29/848, 29/849, 856, 858, 867
See application file for complete search history.

(56) References Cited

U.S. PATENT DOCUMENTS 6,740,862 B2 * 5/2004 Paritsky et al. ............... 250/221
7,309,855 B2 * 12/2007 Nagasaka et al. ........ 250/231.14

* cited by examiner

*Primary Examiner* — Thiem Phan
(74) *Attorney, Agent, or Firm* — Rabin & Berdo, P.C.

(57) ABSTRACT

A method for packaging the sensor units is shown below. First step is providing a substrate, and each sensor area on the substrate is partitioned into two individual circuit areas. An emitter and a detector are installed on the two circuit areas respectively. Step two is forming a first packaging structure to cover the two circuit areas, the emitter and the detector by a mold. Next step is cutting the first packaging structure to form cut groove between and around the emitter and the detector. Next step is forming a second packaging structure in the cut grooves by the same mold. At last, the panel of sensor units is diced and separated as individual sensor units. As above-mentioned, the second packaging structure is used for isolating the signals of the emitter and the detector.

10 Claims, 3 Drawing Sheets

METHOD FOR PACKAGING A SENSOR UNIT

BACKGROUND OF THE INVENTION

1. Field of the Invention

The present invention relates to a sensor unit and a method for packaging the sensor unit, in particular to a packaging method with two molding steps using one mold and a sensor unit with high precision and high reliability.

2. Description of Related Art

Depending on the design of the electronic product, the electronic product is controlled by the input devices such as a key, a keypad, a tracking ball, or a touch panel screen. Recently, the touch panel screen has been widely used in electronic applications. The touch panel screen includes a touch panel which has a transparent panel with a sensitive surface to cover the displaying area of the screen. Users can select the items or move the cursor by using a finger or a touch pen on the touch panel screen so that the electronic device is controlled by the touch signals from the touch panel screen. For example, an IR proximity sensor is widely used in mobile communication devices for detecting the face of users so as to control the mobile communication device.

The proximity sensor is widely used in mobile devices. For example, when the user is away from the screen, the screen will be locked or turned off so as to save the power consuming. On the other hand, when the head of the user is close to the device, the function of screen will be locked to avoid mis-touch issues and problems. Furthermore, a long-range proximity sensor can be used for detecting whether there is an object within the distance of about 20 to 80 cm. Therefore, the long-range proximity sensor can be used in a display device of a desktop computer. When the user leaves the computer, the sensor can detect the motion of the user so as to control the system to turn off the display of the computer.

The proximity sensor has an emitter and a detector. For shielding the crosstalk of signals, the emitter and the detector of the traditional proximity sensor are packaged with packaging materials and a metal frame is assembled with the packaging structure to form an isolating barrier to minimize interference by or among signals. However, the final packaging structure must generally form locking structures to properly assemble the metal frame. The manufacturing processes and the structures are highly complex. In another assembling method, glue is used on the packaging structure for fixing the metal frame on the packaging structure. The glues are not easily controlled. For example, an excess of the may overflow on the structure. On the other hand, the metal frame will not be fixed properly or in an acceptably compact manner with the packaging structure if the amount of glue used is not sufficient. In the case that the metal frame shifts or moves relative to the packaging structure, or departs from the packaging structure, the signals cannot be precisely isolated and shielded.

On the other hand, in small-sized devices, the precise assembling of the metal frame and the packaging structure is necessary for isolating signals. Thus, the assembling processes are more and more complex, thereby complicating assembly processes and the manufacturing yields are likely to decline.

Therefore, in view of this, the inventor proposes the present invention to overcome the above problems based on his significant expert experience and deliberate research.

SUMMARY OF THE INVENTION

A primary objective of the present invention is to provide a sensor unit and the packaging method of the sensor unit. For this, a mold is used in two molding steps for respectively forming the first packaging structure which is used for protecting the emitter and detector, and the second packaging structure which is used for isolating the emitter and the detector. Furthermore, the first and the second packaging structures can be fixed to each other when the two newly assembled packaging structures are cured so that the isolation structure with the stable final unit structure and the complex high-precision structure is formed.

To achieve the above-mentioned objective, the present invention provides a packaging method of a sensor unit. The packaging method has following steps:

Step 1: providing a substrate. The substrate has a plurality of sensor unit areas thereon, and each of the sensor unit areas is partitioned into at least two individual circuit areas thereon. A signal-emitting device of the sensor unit and a signal detecting device of the sensor unit are respectively disposed on the two circuit areas of the sensor unit area.

Step 2: forming a first packaging structure on the substrate via a mold. The first packaging structure covers the two circuit areas, the signal-emitting device and the signal detecting device. There is a cutting area defined between and around the two circuit areas.

Step 3: cutting the first packaging structure along the cutting area to form a first cut groove surrounding the circuit areas, and to form the second cut groove between the circuit areas. Two ends of the second cut groove are connected with the first cut groove.

Step 4: forming a second packaging structure in the first and the second cut grooves using the mold so as to isolate the signal emitting device and the signal detecting device.

Step 5: removing the mold for providing a second cutting step. The individual sensor units are separated by cutting the second packaging structure.

The sensor unit manufactured by the above-mentioned method has substrate which has two individual circuit areas thereon. The signal emitting device and the signal detecting device are respectively disposed on and electrically connected with the two circuit areas. The second packaging structure is disposed on the substrate and surrounds the signal emitting device and the signal detecting device. The second packaging structure is constructed having two cavities for isolating the signal emitting device and the signal detecting device. The first packaging structure is formed in the cavities of the second packaging structure for covering and protecting the signal-emitting device and the signal-detecting device.

In a further embodiment, the second packaging structure is formed between the signal emitting device and the signal detecting device for isolating the signal emitting device and the signal detecting device. The packaging method has the following steps:

Step 1: providing a substrate having a plurality of sensor unit areas thereon, and each of the individual sensor unit areas is partitioned into at least two individual circuit areas thereon. A signal-emitting device of the sensor unit and a signal-detecting device of the sensor unit are respectively disposed on the two circuit areas of the sensor unit area.

Step 2: forming a first packaging structure on the substrate via a mold. The first packaging structure covers the two circuit areas, the signal emitting device and the signal detecting device. There is a cutting area defined between the circuit areas.

Step 3: providing a first cutting step for cutting the first packaging structure along the cutting area to form the second cut groove between the circuit areas until exposing the substrate.

Step 4: forming a second packaging structure in the second cut groove via the mold so as to isolate the signal emitting device and the signal detecting device.

Step 5: removing the mold for providing a second cutting step. The individual sensor units are separated by cutting the first packaging structure The sensor unit has the following advantages. The packaging method of this present invention has two molding steps yet only one mold is needed in the two molding steps so as to reduce the cost of the mold. The sensor has improved the isolation effectiveness and has, therefore, significantly improved reliability.

In order to further and more fully understand the techniques, means, and effects that the present invention perceives and applies for achieving the prescribed objectives, the following detailed descriptions and appended drawings are provided and hereby referred; such that, through which the purposes, features, and aspects of the present invention can be thoroughly and concretely appreciated. It is to be understood, however, that the appended drawings are provided merely for reference and illustration, without intention that they be used for limiting the present invention which is fully described later only in the claims.

DETAILED DESCRIPTION OF THE PREFERRED EMBODIMENTS

Please refer to FIGS. 1 to 4; the present invention provides a packaging method of a sensor unit 1. Two molding steps of one single mold are provided in the packaging method to package and to isolate the elements of the sensor unit 1. The manufacturing cost is decreased and the assembling problems of the traditional sensor are further resolved. The packaging method has the following steps.

Figure 1:
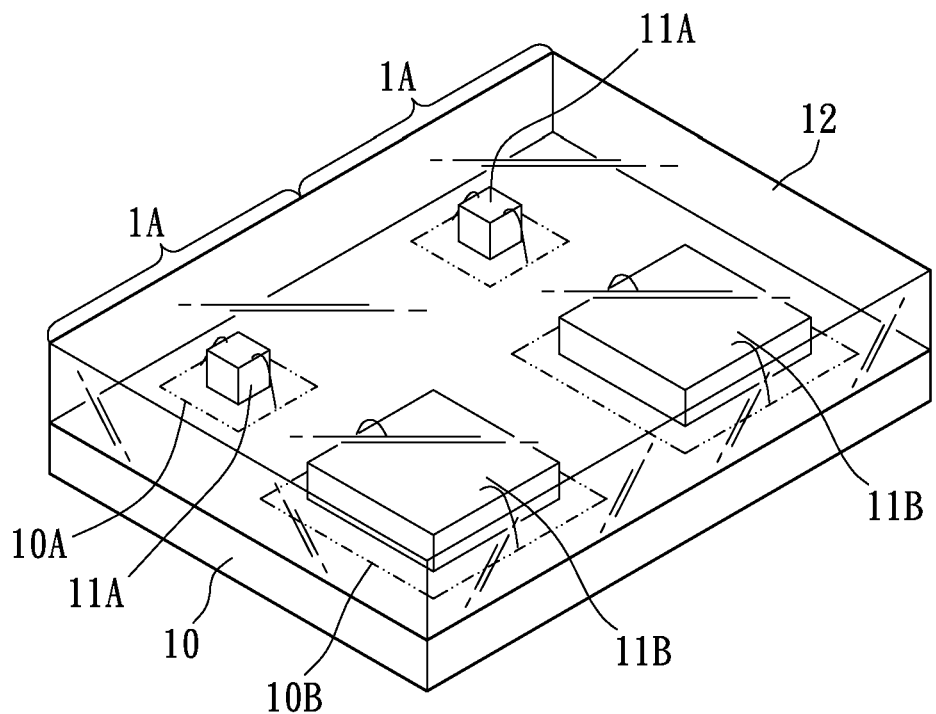
FIGS. 1-4 show the packaging method of the first embodiment of sensor unit according to the present invention.
Figure 4:
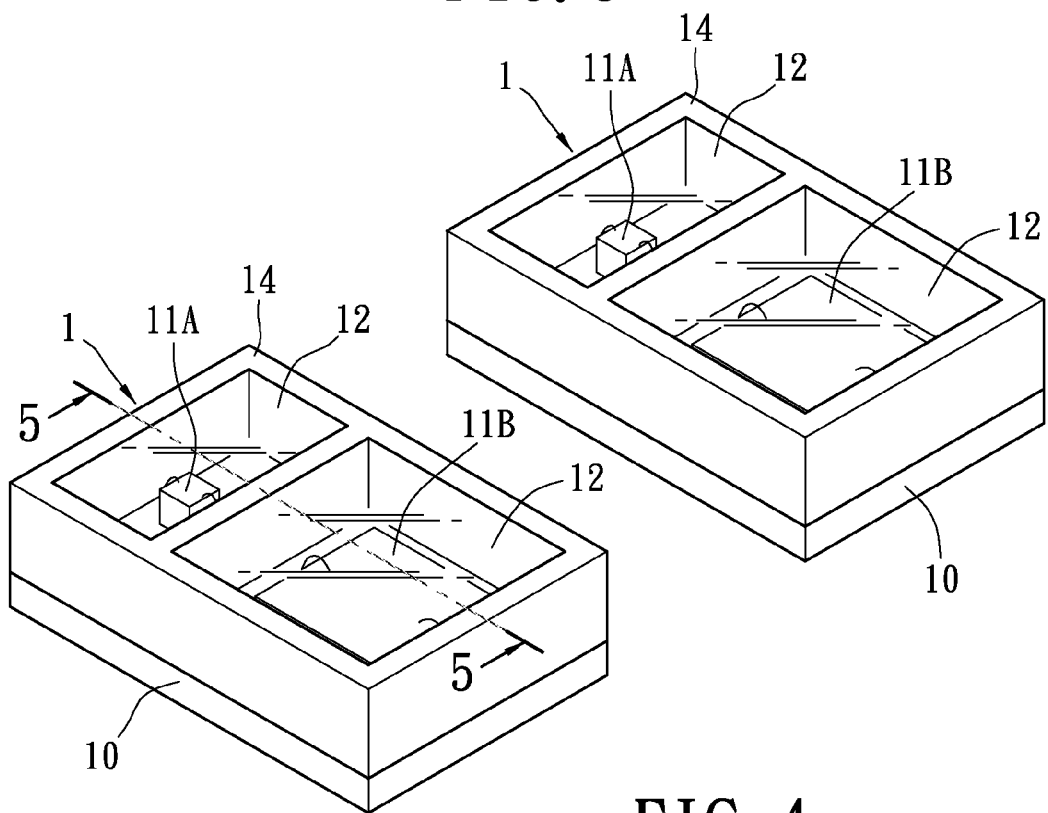

Step 1 of the present invention is providing a substrate 10 having a plurality of sensor unit area 1A thereon. As shown in FIG. 1, the substrate 10 of the first embodiment has two sensor unit areas 1A and each sensor unit area 1A can be manufactured as one single sensor unit 1 (as shown in FIG. 4). Each sensor unit area 1A is partitioned into two individual circuit areas 10A, 10B (or more than two circuit areas). The two circuit areas 10A, 10B are formed on a surface of the substrate 10 and in the interior of the substrate 10, there is a signal-emitting device 11A of the sensor unit 1 and a signal detecting device 11B of the sensor unit 1 are respectively disposed on. Moreover, in the first embodiment the sensor unit 1 is a proximity sensor unit, and the signal emitting device 11A and the signal detecting device 11B are respectively an emitter and a detector. The signal emitting device 11A and the signal detecting device 11B are respectively fixed on the two circuit areas 10A, 10B of the sensor unit area 1A by die attaching method, and the signal emitting device 11A and the signal detecting device 11B are electrically connected to the corresponding circuit area by wires.

Step 2 is forming a first packaging structure 12 on the substrate 10 via a mold. A packaging material is formed on the substrate 10 to cover the two circuit areas 10A, 10B, the signal emitting device 11A and the signal detecting device 11B on the substrate 10. Please refer to FIG. 1; a mold (not shown) is used in Step 2 to perform a first molding step so as to cover the circuit areas 10A, 10B, the signal emitting device 11A and the signal detecting device 11B (i.e., the sensor unit area 1A). On the other hand, a cutting area is defined between the circuit areas 10A, 10B. Moreover, the properties of the packaging material used in this step have to meet the requirements of the operation of the sensor unit 1. For example, the light signals emitted from the signal emitting device 11A have to pass through the first packaging structure 12. Similarly, the signals have to pass through the first packaging structure 12 so that the signals can be detected by the signal detecting device 11B. In application, the signal emitting device 11A can be an integrated ambient and proximity sensor; therefore the packaging material has transmission properties for visible light to provide for transfer of light signals. The signal detecting device 11B can be an IR proximity sensor; therefore the material has transmission property of infrared. In other words, the material of the first packaging structure 12 is not restricted, but the transmission property of the material has to meet the requirement of the signals transmission operations so as to maintain the signal processing quality.

Step 3 is removing the mold and providing a first cutting step. After the packaging material of the first packaging structure 12 is cured, the mold can be removed from the substrate 10. Please refer to FIG. 2; the first cutting step is provided for cutting the first packaging structure 12 along the cutting area on the edges the two circuit areas 10A, 10B to form the first cut groove 13A. In other words, the first cut groove 13A surrounds closely the two circuit areas 10A, 10B of each sensor unit area 1A (Note that 10A and 10B are omitted in FIG. 2 for the sake of simplicity). It is convenient and useful that a second cut groove 13B may be simultaneously formed in the cutting area between the circuit areas 10A, 10B of each sensor unit area 1A. Two ends of the second cut groove 13B are connected to the first cut groove 13A so that the first and the second cut grooves 13A, 13B are constructed as a cut structure with, in this solely representational drawing, a square-sided and -cornered "8-shape". Therefore, the signal-emitting unit of the circuit areas 10A and the signal emitting device 11A is isolated from the signal detecting unit of the circuit areas 10B and the signal detecting device 11B by the first and the second cut grooves 13A, 13B. Furthermore, the substrate 10 is exposed from or by the first and the second cut grooves 13A, 13B.

Figure 2:
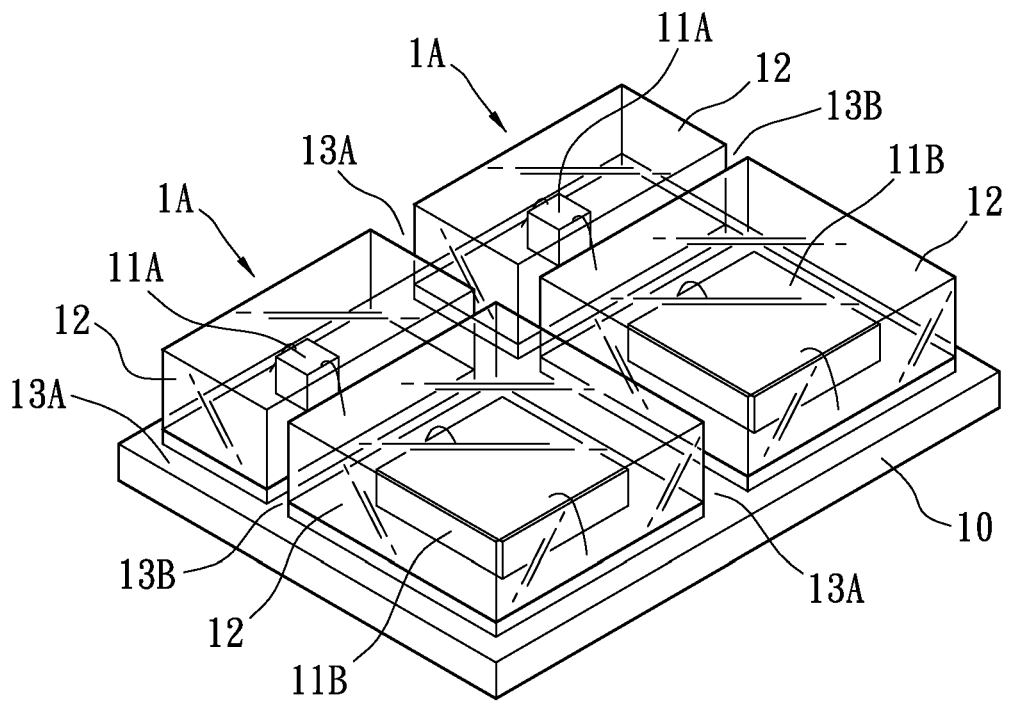
Figure 3:
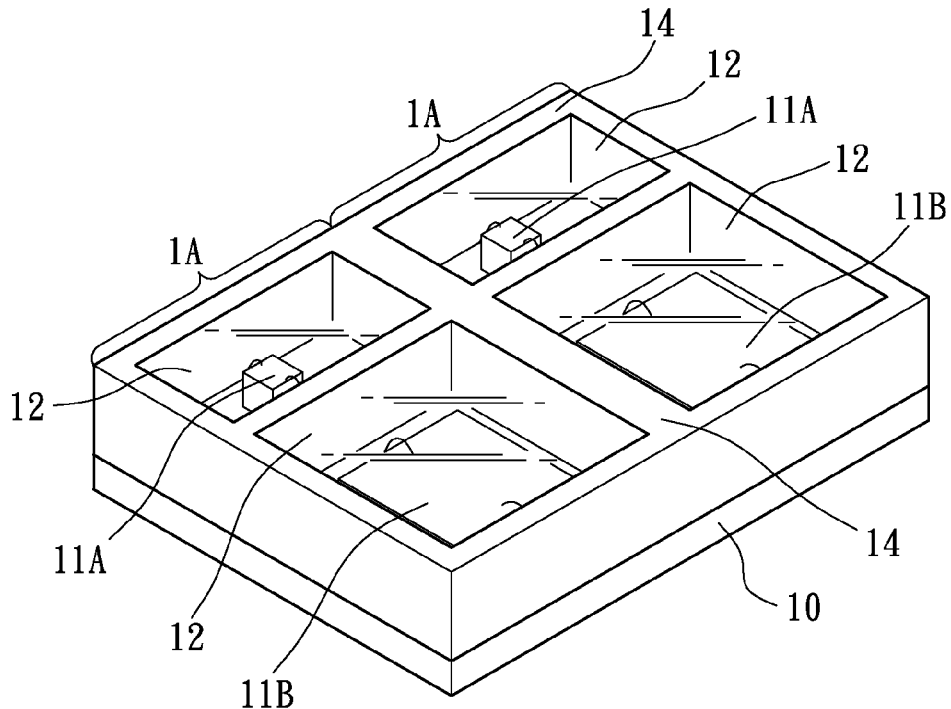

For the reason for isolation, the depth of the first and the second cut grooves 13A, 13B is larger than the thickness of the first packaging structure 12 so as to expose the substrate 10. In the embodiment, the first and the second cut grooves 13A, 13B extend into the substrate 10 to expose the circuit areas 10A, 10B in the interior of the substrate 10. In other words, the first cutting step is provided for removing the material of the first packaging structure 12 and further removing the material of substrate 10 downwardly to form the deep first and the second cut grooves 13A, 13B. In the first embodiment, the substrate 10 has had removal of about 0.2 mm from the surface thereof. Thus, the step-shaped structures on the surface of substrate 10 are shown in FIG. 2.

Step 4 is forming the second packaging structure 14 inside the first and the second cut grooves 13A, 13B by the mold. Please refer to FIG. 3; the mold used in step 2 is used again in this step to perform a second molding step. The mold is used in coordination with the first packaging structure 12 for exposing the first and the second cut grooves 13A, 13B so that another packaging material is filled into the first and the second cut grooves 13A, 13B so that the second packaging structure 14 can be formed. Because the signal emitting unit 11A on the circuit areas 10A is isolated from the signal detecting unit 11B on the circuit areas 10B by the first and the second cut grooves 13A, 13B, the cured second packaging structure 14 is applied for isolating the signal emitting device 11A and the signal detecting device 11B so that the crosstalk of the signal emitting device 11A and the signal detecting device 11B is avoided.

Moreover, the material of the second packaging structure 14 has valuable properties, particularly the property of non-transmission of infrared-range radiation so that the second packaging structure 14 performs and serves as an IR barrier. On the other hand, because the first packaging structure 12 and the second packaging structure 14 are formed by molding method, the first packaging structure 12 and the second packaging structure 14 can be fixed securely. In other words, the separation problem of the first packaging structure 12 from the second packaging structure 14 can be solved.

Figure 5:
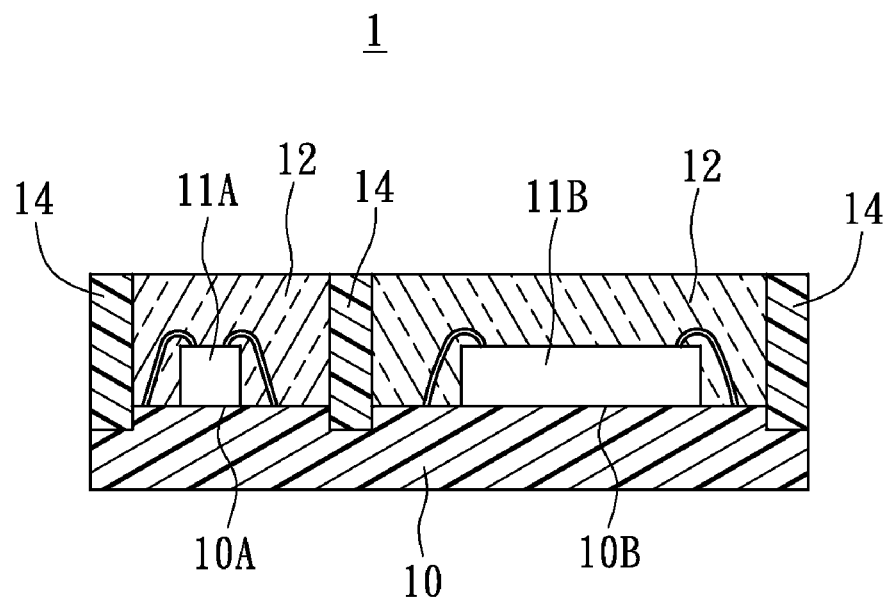
FIG. 5 shows the cross-sectional view along 5-5 in FIG. 4 according to the present invention.

On the other hand, in light of the roughness of the surface of the substrate 10, the bottom of the second packaging structure 14 may not precisely contact the surface of the substrate 10. The above-mentioned imprecise contact will cause the crosstalk of the signal emitting device 11A and the signal detecting device 11B. Therefore, the first and the second cut grooves 13A, 13B extend into the substrate 10 in step 3 so that the second packaging structure 14 can be formed in the substrate 10. As shown in FIG. 5, the second packaging structure 14 extends into the substrate with about 0.2 mm (i.e., the depth of the first and the second cut grooves 13A, 13B in the substrate 10). Therefore, the extended portion of the second packaging structure 14 is used for improving the isolation of the signal emitting device 11A and the signal detecting device 11B; thus a multiplicity of difficulties are addressed by this invention Step 5 is removing the mold and a second cutting step is provided, as shown in FIG. 4. After the second packaging structure 14 is cured, the mold is removed from the substrate 10 for separating the collected sensor units 1. In other words, the panel of the two sensor units 1 is separated into two individual sensor units 1 in the second cutting step and the second cutting step is used for separating the sensor units 1 by cutting along the second packaging structure 14 between the adjacent sensor units 1. The position of the cut path of the second cutting step is overlapped with the position of the first cut groove 13A of the first cutting step. However, the width of the cut path of the second cutting step is smaller than a width of the first cut groove 13A for keeping the second packaging structure 14 on the sides of the signal emitting device 11A and the signal detecting device 11B. In the first embodiment, the width of the first cut groove 13A (i.e., the width of the second packaging structure 14) is about 0 4 mm and the width of the cut path of the second cutting step is about 0.1 mm.

Therefore, the sensor unit 1 is formed after the above-mentioned steps. The sensor unit 1 has a substrate 10 having two individual circuit areas 10A, 10B thereon. The signal emitting device 11A and the signal detecting device 11B are respectively disposed on and electrically connected with the two circuit areas 10A, 10B. The second packaging structure 14 is disposed on the substrate 10 and surrounds the signal emitting device 11A and the signal detecting device 11B so that the second packaging structure 14 is constructed as two cavities for isolating the signal emitting device 11A and the signal detecting device 11B. In other words, the second packaging structure 14 is made of a material with non-transmission property of infrared so that the signal emitting device 11A and the signal detecting device 11B are respectively surrounded by the second packaging structure 14. Thus, the crosstalk problem of signals of the signal emitting device 11A and the signal detecting device 11B is resolved. On the other hand, the first packaging structure 12 is formed in the cavities of the second packaging structure 14 for covering and protecting the signal emitting device 11A and the signal detecting device 11B. The first packaging structure 12 and the second packaging structure 14 are formed by the same mode in the first and second molding steps. Therefore, the cost of molding can be reduced. Furthermore, the first packaging structure 12 and the second packaging structure 14 are precisely formed so that the separation issue of the first packaging structure 12 and the second packaging structure 14 can be affirmatively resolved and the isolation is improved.

On the other hand, the second packaging structure 14 extends into the substrate 10 so that the signals of the signal emitting device 11A and the signals of the signal detecting device 11B are improved by being affirmatively isolated from each other. Moreover, the first packaging structure 12 and second packaging structure 14 have similar physical characteristics, such as heat expansion property so that the sensor unit 1 has improved reliability when the sensor unit 1 is operated in high temperature application.

Figure 6:
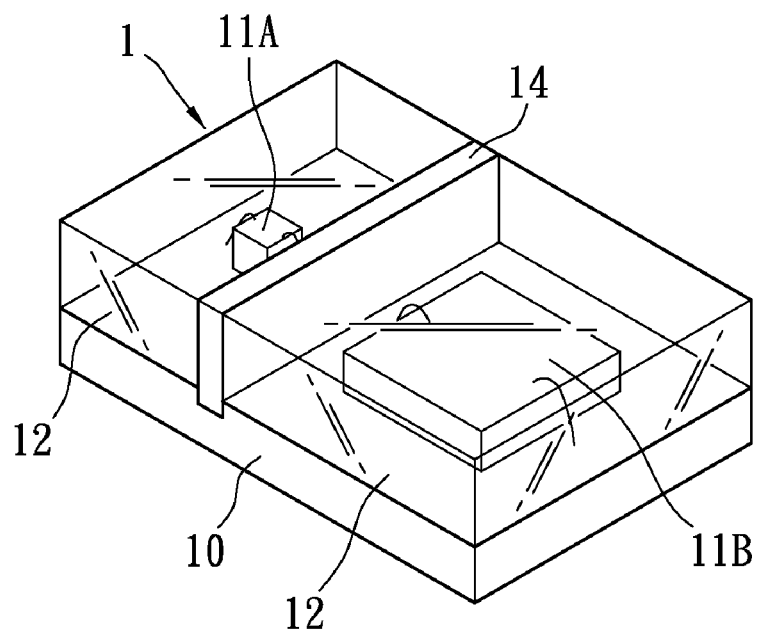
FIG. 6 shows the second embodiment of the sensor unit according to the present invention.

Please refer to FIG. 6; the second embodiment of the present invention is shown. In the second embodiment, the second packaging structure 14 is formed only between the signal emitting device 11A and the signal detecting device 11B. The packaging method of the second embodiment has the following steps.

Step 1 of the second embodiment is providing a substrate 10 having a plurality of sensor unit area 1A thereon. As shown in FIG. 1, similar to the first embodiment, the substrate 10 of the second embodiment has two sensor units area 1A and each sensor unit area 1A can be manufactured as one single sensor unit 1 (as shown in FIG. 4). Each sensor unit area 1A is partitioned into two individual circuit areas 10A, 10B (or more than two circuit areas), and the two circuit areas 10A, 10B are formed on a surface of the substrate 10 and in the interior of the substrate 10. A signal emitting device 11A of the sensor unit 1 and a signal detecting device 11B of the sensor unit 1 are respectively disposed on the two circuit areas 10A, 10B.

Step 2 is forming a packaging material into the first packaging structure 12 by a mold in first molding step. The first packaging structure 12 covers the circuit areas 10A, 10B, the signal emitting device 11A and the signal detecting device 11B. There is a cutting area defined between the two circuit areas 10A, 10B.

Step 3 is providing a first cutting step to form the second cut groove 13B on the cutting area between the circuit areas 10A, 10B. The substrate 10 is exposed from the second cut groove 13B Similarly with the first embodiment, the second cut groove 13B extends into the substrate 10 so as to isolate the signals by the second packaging structure 14.

Step 4 is forming the second packaging structure 14 inside the second cut groove 13B by the mold. The mold is used in coordination with the first packaging structure 12 for exposing the second cut groove 13B so that another packaging material is filled into the second cut groove 13B for forming the second packaging structure 14. The second packaging structure 14 is used for isolating the signal emitting device 11A and the signal detecting device 11B.

Step 5 is removing the mold and a second cutting step is provided. The second cutting step is applied for cutting the first packaging structure 12 between the adjacent sensor units 1 so as to separate the collected sensor units 1 into individual sensor units 1.

On the other hand, the materials and the packaging conditions of the second embodiment are similar with the first embodiment.

Consequently, the sensor unit 1 of the present invention has the beneficial effects as follows:

1. With regarding the packaging processes, the packaging method of the present invention has two molding steps and only one mold is needed throughout the two molding steps. The cost of the mold is reduced. Furthermore, the precision of the sensor unit of the present invention is improved.

2. The packaging structure formed by the two molding steps can be formed precisely. In other words, the first and the second packaging structures can be fixed compactly so that the first and the second packaging structures are not easily separated from each other. Moreover, the sensor unit has high reliability.

The above-mentioned descriptions represent merely the preferred embodiment of the present invention, this is offered for the purposes of clear and thorough communication and disclosure; it does not in any manner limit the scope of the present invention thereto. Various equivalent changes, alternations, or modifications based on the claims of present invention are all reasonably and consequently viewed as being embraced by the scope of the present invention.

What is claimed is:

1. A method for packaging a sensor unit, comprising steps of:
providing a substrate having a plurality of sensor unit area, a signal emitting device, a signal detecting device of the sensor unit thereon, wherein each of the sensor unit area is partitioned into at least two individual circuit areas, where the signal emitting device and the signal detecting device are respectively disposed on the two circuit areas of the sensor unit area on surface and in interior of the substrate;
forming a first packaging structure on the substrate to cover the two circuit areas of the sensor unit area, the signal emitting device the signal detecting device, and a cutting area defined on between the two circuit areas using a mold;
cutting the first packaging structure along the cutting area to form a second cut groove between the two circuit areas so that the substrate is exposed from the second cut groove; and
forming a second packaging structure in the second cut groove using the mold so that the signal emitting device and the signal detecting device of the same sensor unit area are isolated form each other.

2. The method according to claim 1, wherein in the step of cutting the first packaging structure, a first cut groove is formed in the first packaging structure to surround closely the two circuit areas of the sensor unit area so that the substrate is exposed from the first cut groove, and two ends of the second cut groove are connected with the first cut groove.

3. The method according to claim 2, wherein in the step of forming a second packaging structure, the second packaging structure is further formed in the first packaging structure so as to surround closely the two circuit areas of the sensor unit area, and the second packaging structure filled in the second cut groove is located between the signal emitting device and the signal detecting device.

4. The method according to claim 3, wherein after the step of forming a second packaging structure, a second cutting step of separating the second packaging structure between the adjacent sensor unit area is provided so as to form individual sensor units.

5. The method according to claim 4, wherein in the step of forming a second packaging structure, a material with non-transmission property of infrared is filled into the first cut groove and the second cut groove and then the filled material is cured to form the second packaging structure.

6. The method according to claim 4, wherein in the second cutting step, a width of a cut path of the second cutting step is smaller than a width of the first cut groove.

7. The method according to claim 2, wherein the first cut groove has a first depth, the second cut groove has a second depth, and the first depth and second depth are larger than a thickness of the first packaging structure so that the circuit areas formed in the interior of the substrate are exposed.

8. The method according to claim 1, wherein after the step of forming a second packaging structure, a step of cutting the first packaging structure between the adjacent sensor unit area is provided so as to form individual sensor units.

9. The method according to claim 1, wherein the signal emitting device and the signal detecting device of the same sensor unit area are respectively fixed on the two circuit areas of the sensor unit area by die attaching method, and are respectively connected electrically to the corresponding circuit area via a wire.

10. The method according to claim 1, wherein the first packaging structure is made of a material with transmission property of visible light or a material with infrared transmission property.

* * * * *